(12) United States Patent
Ito et al.

(10) Patent No.: US 11,342,201 B2
(45) Date of Patent: May 24, 2022

(54) SUBSTRATE PROCESSING APPARATUS

(71) Applicant: SCREEN Holdings Co., Ltd., Kyoto (JP)

(72) Inventors: Tetsuo Ito, Kyoto (JP); Noriyuki Kikumoto, Kyoto (JP); Kazuki Inoue, Kyoto (JP); Kunio Yamada, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 95 days.

(21) Appl. No.: 16/802,577

(22) Filed: Feb. 27, 2020

(65) Prior Publication Data

US 2020/0312679 A1 Oct. 1, 2020

(30) Foreign Application Priority Data

Mar. 28, 2019 (JP) .............................. JP2019-063855

(51) Int. Cl.
*F26B 21/06* (2006.01)
*H01L 21/67* (2006.01)
*F26B 3/28* (2006.01)
*F26B 21/14* (2006.01)

(52) U.S. Cl.
CPC ........ *H01L 21/67034* (2013.01); *F26B 3/283* (2013.01); *F26B 21/14* (2013.01)

(58) Field of Classification Search
CPC ......... H01L 21/67034; H01L 21/67051; H01L 21/67745; H01L 21/67017; H01L 21/67196; H01L 21/67742; H01L 21/6704; H01L 21/67075; F26B 3/283; F26B 21/14; B01D 46/42

USPC .................................... 34/78, 82, 77, 72, 84
See application file for complete search history.

(56) References Cited

U.S. PATENT DOCUMENTS

| | | | |
|---|---|---|---|
| 6,632,281 B2 | 10/2003 | Kitano et al. | |
| 7,208,066 B2 | 4/2007 | Kitano et al. | |
| 7,401,988 B2 | 7/2008 | Katano et al. | |
| 9,704,727 B2 | 7/2017 | Segawa et al. | |
| 10,170,349 B2 | 1/2019 | Maeda | |
| 10,192,765 B2 | 1/2019 | Koshti et al. | |
| 10,658,217 B2 | 5/2020 | Kawai et al. | |
| 10,672,632 B2 | 6/2020 | Kawai et al. | |

(Continued)

FOREIGN PATENT DOCUMENTS

| | | |
|---|---|---|
| JP | 3135981 | 2/2001 |
| JP | 4033757 | 1/2008 |

(Continued)

*Primary Examiner* — John P McCormack
(74) *Attorney, Agent, or Firm* — JCIPRNET

(57) ABSTRACT

In a substrate processing apparatus, a transport robot which transports a substrate between an indexer part and a substrate processing part is installed in a substrate transport part. The transport fan filter unit is provided in an upper part of the substrate transport part. An exhaust port is provided in the substrate transport part. The circulation piping allows the exhaust port of the substrate transport part and the transport fan filter unit to communicate with each other. The exhaust pipe is connected to the circulation piping. The inert gas supply part supplies an inert gas to the circulation piping. The circulation fan filter unit is disposed downstream of a connecting portion of the circulation piping with the exhaust pipe to be parallel to a flow path of the circulation piping.

13 Claims, 9 Drawing Sheets

(56) References Cited

U.S. PATENT DOCUMENTS

| | | | |
|---|---|---|---|
| 2007/0128356 A1 | 6/2007 | Matsuyama et al. | |
| 2007/0286712 A1 | 12/2007 | Rebstock | |
| 2015/0117987 A1* | 4/2015 | Choi ................ | H01L 21/67742 |
| | | | 414/222.02 |
| 2015/0170945 A1 | 6/2015 | Segawa et al. | |
| 2018/0040493 A1* | 2/2018 | Kawai ...................... | F24F 6/00 |
| 2018/0366355 A1* | 12/2018 | Koshti .............. | H01L 21/67253 |
| 2019/0001242 A1* | 1/2019 | Siok .................. | B01D 39/2041 |
| 2019/0006215 A1 | 1/2019 | Aoyama et al. | |
| 2019/0096719 A1 | 3/2019 | Maeda | |
| 2019/0201949 A1 | 7/2019 | Okita et al. | |
| 2019/0362997 A1 | 11/2019 | Koshti et al. | |
| 2020/0135521 A1* | 4/2020 | Reuter .............. | H01L 21/67389 |
| 2020/0312686 A1 | 10/2020 | Kawai et al. | |

FOREIGN PATENT DOCUMENTS

| | | |
|---|---|---|
| JP | 5366030 | 12/2013 |
| JP | 2014067797 | 4/2014 |
| JP | 2015146348 | 8/2015 |
| JP | 5934165 | 6/2016 |
| JP | 2018046272 | 3/2018 |
| JP | 2018152592 | 9/2018 |
| JP | 2019009368 | 1/2019 |
| KR | 100701578 | 4/2007 |
| KR | 20070087495 | 8/2007 |
| KR | 20100048406 | 5/2010 |
| KR | 20170121190 | 11/2017 |
| TW | 200832588 | 8/2008 |
| TW | 201637112 | 10/2016 |
| TW | 201835976 | 10/2018 |
| TW | 201836040 | 10/2018 |

* cited by examiner

SUBSTRATE PROCESSING APPARATUS

CROSS-REFERENCE TO RELATED APPLICATIONS

This application claims the priority of Japanese Patent Application No. 2019-063855 filed on Mar. 28, 2019 based on United States Patent Law Article 119. The entirety of the above-mentioned patent application is hereby incorporated by reference herein and made a part of this specification.

BACKGROUND

Technical Field

The disclosure relates to a substrate processing apparatus.

Description of Related Art

A substrate processing apparatus is used, for example, for manufacturing a semiconductor substrate or a glass substrate. In a substrate processing apparatus, a substrate is dried after the substrate is processed with processing liquid. In recent years, miniaturization of a substrate structure has been promoted, and cleaning and drying of a substrate have become problems. In some substrate processing apparatuses, drying of a processing liquid is promoted by supplying an inert gas.

SUMMARY

According to an aspect of the disclosure, a substrate processing apparatus includes an indexer robot, an indexer part, a substrate processing part, a transport robot, a substrate transport part, a transport fan filter unit, an exhaust port, a circulation piping, an exhaust pipe, an inert gas supply part, and a circulation fan filter unit. The indexer robot loads a substrate in. The indexer robot is installed in the indexer part. The substrate processing part processes the substrate. The transport robot transports the substrate between the indexer part and the substrate processing part. The transport robot is installed in the substrate transport part. The transport fan filter unit is provided on an upper part of the substrate transport part. The exhaust port is provided in the substrate transport part. The circulation piping allows the exhaust port of the substrate transport part and the transport fan filter unit to communicate with each other. The exhaust pipe is connected to the circulation piping. The inert gas supply part supplies an inert gas to the circulation piping. The circulation fan filter unit is disposed downstream of a connecting portion of the circulating pipe with the exhaust pipe to be parallel to a flow path of the circulating pipe.

DESCRIPTION OF THE EMBODIMENTS

Figure 1A:
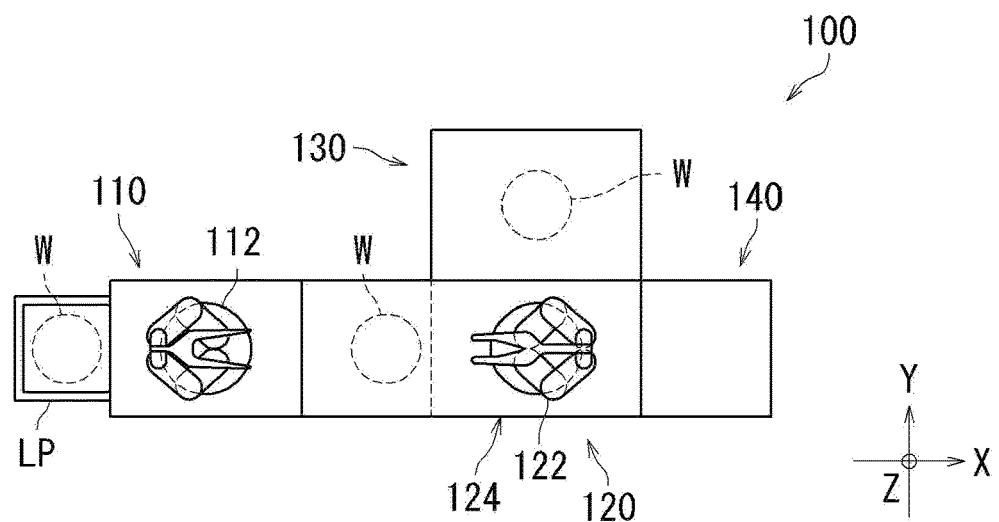
FIG. 1A is a schematic top view of a substrate processing apparatus of the present embodiment.

Hereinafter, a substrate processing apparatus according to the present embodiment will be described with reference to the drawings. In the drawings, the same or corresponding parts are denoted by the same reference numerals, and description thereof will not be repeated. In the specification of the present application, an X direction, a Y direction, and a Z direction that are orthogonal to each other may be described to facilitate understanding. Typically, the X and Y directions are parallel to a horizontal direction, and the Z direction is parallel to a vertical direction.

Figure 1B:
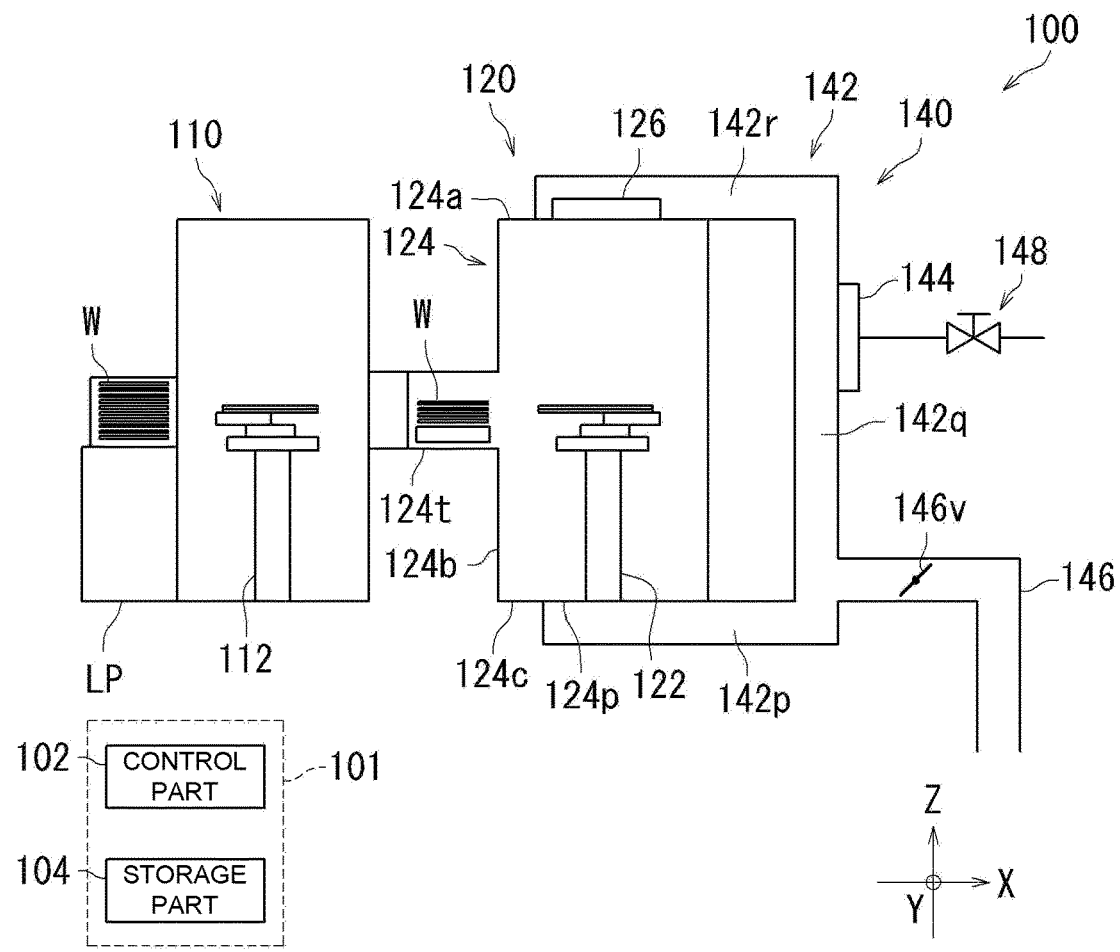
FIG. 1B is a schematic side view of the substrate processing apparatus of the present embodiment.

A substrate processing apparatus 100 of the present embodiment will be described with reference to FIGS. 1A and 1B. FIG. 1A is a schematic top view of the substrate processing apparatus 100 of the present embodiment, and FIG. 1B is a schematic side view of the substrate processing apparatus 100 of the present embodiment.

The substrate processing apparatus 100 processes a substrate W. The substrate processing apparatus 100 processes the substrate W to perform at least one of etching, surface treatment, property assignment, processing film formation, removal of at least a part of the film, and cleaning on the substrate W.

The substrate W has a thin plate shape. Typically, the substrate W has a thin and substantially discoid shape. The substrate W includes, for example, a semiconductor wafer, a liquid crystal display substrate, a plasma display substrate, a field emission display (FED) substrate, an optical disc substrate, a magnetic disk substrate, a magneto-optical disc substrate, a photomask substrate, a ceramic substrate, a solar cell substrate, and the like.

The substrate processing apparatus 100 processes the substrate W with the processing liquid. Here, the substrate processing apparatus 100 processes substrates W one by one with the processing liquid.

As shown in FIG. 1A, the substrate processing apparatus 100 is equipped with an indexer part 110, a substrate transport part 120, a substrate processing part 130, and a gas adjustment part 140. Here, the indexer part 110, the substrate transport part 120, and the gas adjustment part 140 are linearly arranged in the X direction, and the substrate transport part 120 and the substrate processing part 130 are linearly arranged in the Y direction. The substrate W is transported from a load port LP to the substrate processing part 130 via the indexer part 110 and the substrate transport part 120, and is processed in the substrate processing part 130. Thereafter, the substrate W is transported from the substrate processing part 130 to the load port LP via the substrate transport part 120 and the indexer part 110.

The gas adjustment part 140 adjusts a component of the gas in the substrate transport part 120. Here, the gas adjustment part 140 adjusts the oxygen concentration of the gas in the substrate transport part 120.

The gas adjustment part 140 supplies an inert gas to the substrate transport part 120. Further, the gas adjustment part 140 exhausts the gas from the substrate transport part 120. The gas adjustment part 140 may be capable of switching the gas to be supplied to the substrate transport part 120 between an inert gas and air.

The load port LP is disposed adjacent to the indexer part 110. The load port LP accommodates a plurality of substrates W in a stacked manner.

An indexer robot 112 is installed in the indexer part 110. The indexer robot 112 transports the substrate W. The indexer robot 112 transports the substrate W between the load port LP and the substrate transport part 120.

A transport robot 122 is installed in the substrate transport part 120. The transport robot 122 transports the substrate W between the indexer part 110 and the substrate processing part 130. The transport robot 122 may be called a center robot.

The substrate transport part 120 has a housing 124. The transport robot 122 is surrounded by the housing 124.

The housing 124 includes an upper part 124a, side parts 124b, and a bottom part 124c. The upper part 124a is connected to the side parts 124b, and the bottom part 124c is connected to the side parts 124b. The side parts 124b surround four sides of the transport robot 122. The upper part 124a is located above the transport robot 122. The transport robot 122 may be installed on the bottom part 124c.

A table 124t is provided in a portion of the side part 124b of the housing 124 facing the indexer part 110. The indexer robot 112 places the substrate W on the table 124t of the housing 124. The transport robot 122 receives the substrate W placed on the table 124t. The table 124t is used for delivering the substrate W.

A transport fan filter unit 126 is provided on the upper part 124a of the substrate transport part 120. The transport fan filter unit 126 suctions an external gas, filters the gas, and blows the gas out in a predetermined direction. For example, the transport fan filter unit 126 suctions the gas on one side, filters the gas, and blows the gas out to the other side. The transport fan filter unit 126 blows the gas into the housing 124. In this specification, the transport fan filter unit 126 may be described as a transport FFU 126.

The transport FFU 126 has a fan and a filter. In the transport FFU 126, the fan and the filter are disposed in the housing. The filter of the transport FFU 126 is disposed on the side from which the gas is blown out by the fan. The filter filters floating matter from the passing gas.

The transport FFU 126 is installed on the upper part 124a of the substrate transport part 120, and the outlet of the transport FFU 126 faces the bottom part 124c of the housing 124. Therefore, the gas that is blown out from the transport FFU 126 flows vertically downward. Therefore, a downflow is formed in the substrate transport part 120 by the transport FFU 126.

The housing 124 is provided with an exhaust port 124p. In FIG. 1B, the exhaust port 124p is provided at the bottom part 124c of the housing 124. The exhaust port 124p may be provided on the side part 124b of the housing 124. The gas that is blown out from the transport FFU 126 to the housing 124 passes through the inside of the housing 124 and flows toward the exhaust port 124p.

The gas adjustment part 140 includes a circulation piping 142, a circulation fan filter unit 144, an exhaust pipe 146, and an inert gas supply part 148. In this specification, the circulation fan filter unit 144 may be described as a circulation FFU 144. In this specification, the inert gas supply part 148 may be simply referred to as a gas supply part 148.

The circulation piping 142 connects the exhaust port 124p of the substrate transport part 120 and the transport FFU 126. The exhaust port 124p is located upstream of the circulation piping 142, and the transport FFU 126 is located downstream of the circulation piping 142. The gas in the substrate transport part 120 can be circulated by the circulation piping 142.

A circulation FFU 144 is installed in the circulation piping 142. The circulation FFU 144 filters the passing gas and blows the gas out into the circulation piping 142.

The circulation FFU 144 has a fan and a filter. The fan and filter of the circulation FFU 144 are disposed in the housing. The circulation FFU 144 suctions the external gas, filters the gas, and blows the gas out. The filter of the circulation FFU 144 is disposed at a position at which the gas is blown out by the fan. The filter filters the passing gas.

The circulation FFU 144 is disposed to be parallel with the flow path of the circulation piping 142. For this reason, the circulation FFU 144 blows the gas out toward the side surface of the circulation piping 142.

The exhaust pipe 146 is connected to the circulation piping 142. The gas in the substrate transport part 120 is exhausted to the outside by passing through the exhaust pipe 146 via the circulation piping 142.

A valve 146v is provided at a connecting portion between the circulation piping 142 and the exhaust pipe 146. The valve 146v adjusts the flow of gas passing through the exhaust pipe 146. The valve 146v is disposed near a portion of the exhaust pipe 146 connected to the circulation piping 142.

The valve 146v can be opened and closed. The valve 146v is switchable between an open state and a closed state. For example, the valve 146v may be switchable between the open state and the closed state in a plurality of steps.

When the valve 146v is opened, the circulation piping 142 is connected to the outside via the exhaust pipe 146. Therefore, the air in the substrate transport part 120 passes through the circulation piping 142 from the exhaust port 124p, and is exhausted to the outside via the exhaust pipe 146. An amount of gas to be exhausted from the substrate transport part 120 is substantially the same as an amount of gas to be supplied to the substrate transport part 120, and the pressure in the substrate transport part 120 is maintained substantially constant.

When the valve 146v is closed, the circulation piping 142 is not connected to the outside via the exhaust pipe 146. Therefore, the air of the substrate transport part 120 passes through the circulation piping 142 via the exhaust port 124p, and returns to the substrate transport part 120 again.

The inert gas supply part 148 supplies an inert gas to the circulation piping 142. The inert gas supplied to the circulation piping 142 flows to the substrate transport part 120.

Here, the circulation FFU 144 is disposed between the circulation piping 142 and the gas supply part 148. Therefore, the inert gas supplied from the inert gas supply part 148 flows into the circulation piping 142 via the circulation FFU 144. In this case, when the inert gas is supplied from the gas supply part 148 to the circulation piping 142, the inert gas is filtered and blown out in the circulation FFU 144. Therefore, it is possible to suppress floating matter from flowing into the substrate transport part 120 together with the inert gas.

It is preferable that the circulation FFU 144 be capable of switching between blowing the inert gas and the air out to the circulation piping 142. In this case, when the circulation FFU 144 blows the air out to the circulation piping 142, the air is filtered and blown out in the circulation FFU 144. Therefore, it is possible to suppress floating matter from flowing into the substrate transport part 120 together with the air.

When the substrate transport part 120 transports the substrate W, since the gas adjustment part 140 supplies an inert gas to the substrate transport part 120 via the circulation piping 142, oxidation of the substrate W during transportation can be suppressed. In an example, the gas adjustment part 140 supplies nitrogen gas as an inert gas to the substrate transport part 120. Alternatively, the gas adjustment part 140 may supply a rare gas as an inert gas to the substrate transport part 120. For example, the gas adjustment part 140 may supply argon gas as an inert gas to the substrate transport part 120.

In the substrate processing apparatus 100 of the present embodiment, the circulation FFU 144 is disposed downstream of a portion of the circulation piping 142 connected to the exhaust pipe 146 to be parallel to the flow path of the circulation piping 142. Since the circulation FFU 144 can supply a fluid from which contaminants are removed due to its structure, contamination inside the substrate transport part 120 can be suppressed. The circulation FFU 144 of the present embodiment has the following effects due to its arrangement. On a downstream side of the portion of the circulation piping 142 connected to the exhaust pipe 146, the pressure of the fluid flowing through the circulation piping 142 easily decreases, and the oxygen component easily remains. In contrast, in the substrate processing apparatus 100, since the circulation FFU 144 is located downstream of the portion of the circulation piping 142 connected to the exhaust pipe 146, it is possible to suppress a decrease in the pressure of the fluid flowing through the circulation piping 142. Further, at the same time, since the circulation FFU 144 is disposed to be parallel to the flow path of the circulation piping 142, the fluid is supplied in a direction traversing the flow path direction of the circulation piping 142. The supplied fluid has a function of suppressing the entry of the fluid mixed in from the circulation piping 142 or the exhaust pipe 146 located upstream when viewed from the circulation FFU 144. Thus, for example, when the inert gas is blown out from the circulation FFU 144, it is possible to reduce the possibility of oxygen mixed in from the outside through the exhaust pipe 146 entering the inside of the substrate transport part 120.

Furthermore, in the substrate processing apparatus 100, since the gas supply part 148 supplies the inert gas to the downstream side of the portion of the circulation piping 142 connected to the exhaust pipe 146, it is possible to suppress air from entering the circulation piping 142 from the exhaust pipe 146, and the oxygen concentration in the circulation piping 142 can be reduced. For this reason, it is possible to reduce the oxygen concentration in the circulation piping 142 and the oxygen concentration of gas in the substrate transport part 120.

Here, the circulation FFU 144 is disposed so that a longitudinal direction extends in the vertical direction. For this reason, the circulation FFU 144 is disposed along the flow path of the circulation piping 142. By disposing the circulation FFU 144 in the vertical direction, it is possible to suppress an increase in floor area for installing the circulation FFU 144.

The substrate processing apparatus 100 of the present embodiment is suitably used for processing a semiconductor substrate provided with a semiconductor. The semiconductor substrate is processed in the substrate processing part 130. Typically, the semiconductor substrate has a conductive layer and an insulating layer stacked on a base material. The substrate processing apparatus 100 is suitably used for cleaning and/or processing (for example, etching, property change, and the like) of the conductive layer and/or the insulating layer when the semiconductor substrate is manufactured.

The circulation piping 142 has a bottom pipe 142*p*, a side pipe 142*q*, and a top pipe 142*r*. The bottom pipe 142*p* is in communication with the side pipe 142*q*, and the side pipe 142*q* is in communication with the top pipe 142*r*. The bottom pipe 142*p* is located vertically below the housing 124 of the substrate transport part 120. The side pipe 142*q* corresponds to the height of the housing 124. The top pipe 142*r* is located vertically above the housing 124 of the housing 124.

The bottom pipe 142*p* and the top pipe 142*r* extend in the horizontal direction, and the side pipe 142*q* extends in the vertical direction. Here, the circulation FFU 144 is attached to the side part of the side pipe 142*q* of the circulation piping 142.

The substrate processing apparatus 100 further includes a control device 101. The control device 101 controls various operations of the substrate processing apparatus 100.

The control device 101 includes a control part 102 and a storage part 104. The control part 102 includes a processor. The processor has, for example, a central processing unit (CPU). Alternatively, the processor may have a general-purpose processing unit. For example, the control part 102 controls the indexer part 110, the substrate transport part 120, the substrate processing part 130, and the gas adjustment part 140. In an example, the control part 102 controls the indexer robot 112, the transport robot 122, the transport FFU 126, the substrate processing part 130, the circulation FFU 144, the valve 146*v*, and the gas supply part 148.

The storage part 104 stores data and computer programs. The storage part 104 includes a main storage device and an auxiliary storage device. The main storage device is, for example, a semiconductor memory. The auxiliary storage device is, for example, a semiconductor memory and/or a hard disk drive. The storage part 104 may include a removable medium. The control part 102 executes a computer program stored in the storage part 104.

The storage part 104 stores a computer program in which a procedure is defined in advance, and the substrate processing apparatus 100 operates according to the procedure defined in the computer program.

The control part 102 may control the gas adjustment part 140 to adjust the gas component of the substrate transport part 120. For example, the oxygen concentration of the gas in the substrate transport part 120 may be changed from a concentration similar to the oxygen concentration in the air to a concentration lower than the oxygen concentration in the air. In this specification, a mode in which the oxygen concentration of the gas in the substrate transport part 120 is reduced may be referred to as an oxygen reduction mode.

Alternatively, the oxygen concentration of the gas in the substrate transport part 120 may be changed from a concentration lower than the oxygen concentration in the air to a concentration similar to the oxygen concentration in the air. In this specification, a mode in which the oxygen concentration of the gas in the substrate transport part 120 is increased may be referred to as an oxygen increase mode.

Further, the control part 102 may control the gas adjustment part 140 to maintain the oxygen concentration of the gas of the substrate transport part 120. For example, the oxygen concentration of the gas in the substrate transport part 120 may be kept at a concentration lower than the oxygen concentration in the air. In the specification, a mode in which the oxygen concentration of the gas in the substrate transport part 120 is kept at a concentration lower than that of air may be referred to as a low oxygen maintenance mode. Typically, when the substrate W is transported between the indexer part 110 and the substrate processing part 130 over the substrate transport part 120, the substrate transport part 120 is maintained at a low oxygen concentration.

Figure 2A:
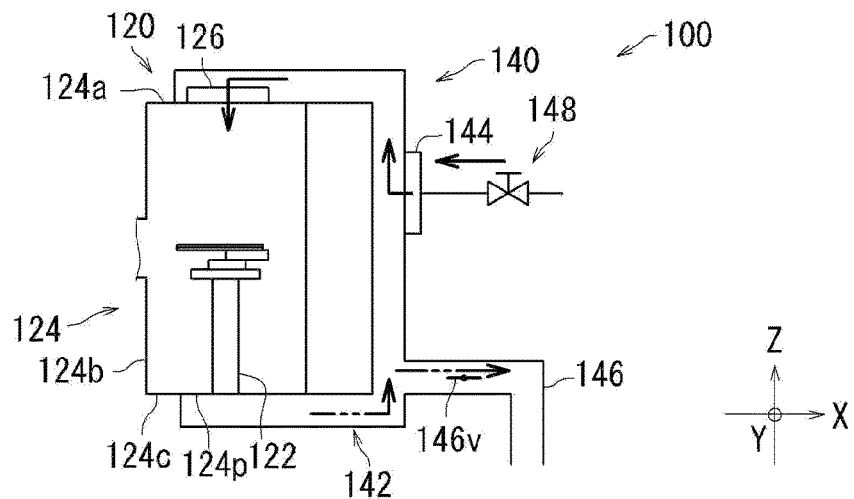
FIGS. 2A to 2C are schematic views of the substrate processing apparatus of the present embodiment in an oxygen reduction mode, a low oxygen maintenance mode, and an oxygen increase mode, respectively.
Figure 2B:
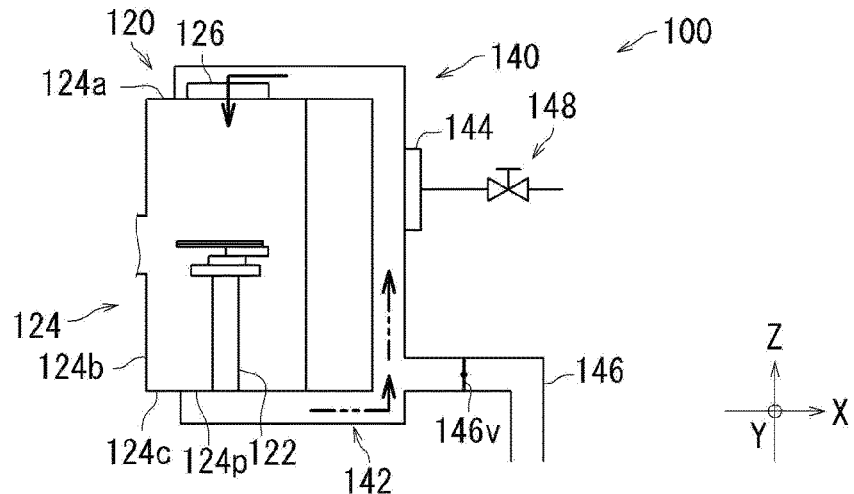
Figure 2C:
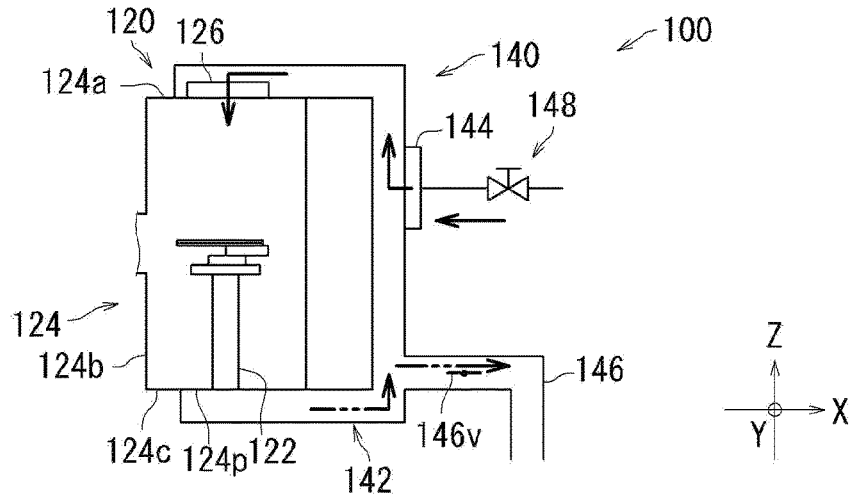

Hereinafter, adjustment of the oxygen concentration of the substrate transport part 120 performed by the gas adjustment part 140 in the substrate processing apparatus 100 of the present embodiment will be described with reference to FIGS. 2A to 2C. FIG. 2A is a schematic view of the substrate processing apparatus 100 in the oxygen reduction mode, FIG. 2B is a schematic view of the substrate processing apparatus 100 in the low oxygen maintenance mode, and FIG. 2C is a schematic view of the substrate processing apparatus 100 in the oxygen increase mode. FIGS. 2A to 2C show only the substrate transport part 120 and the gas adjustment part 140 in the substrate processing apparatus 100 shown in FIG. 1B.

As shown in FIG. 2A, in the oxygen reduction mode, the substrate processing apparatus 100 reduces the oxygen concentration of the gas in the substrate transport part 120, by replacing the gas in the substrate transport part 120 with an inert gas. In this case, the gas adjustment part 140 supplies the inert gas to the substrate transport part 120. Further, the gas adjustment part 140 exhausts the gas from the substrate transport part 120.

The fan of the circulation FFU 144 is driven, and the gas supply part 148 supplies the inert gas to the circulation FFU 144. For this reason, the circulation FFU 144 blows the inert gas, which is supplied from the gas supply part 148, out toward the transport FFU 126 along the circulation piping 142. Accordingly, the inert gas reaches the transport FFU 126 via the circulation FFU 144. The transport FFU 126 blows the inert gas out into the housing 124. Further, also in any of FIGS. 2A to 2C, the fan of the transport FFU 126 is driven, and the transport FFU 126 supplies the gas, which has passed through the circulation piping 142, to the substrate transport part 120.

The valve 146v is opened, and the exhaust pipe 146 is connected to the outside. For this reason, the air in the substrate transport part 120 passes through the circulation piping 142 and is exhausted to the outside via the exhaust pipe 146. The amount of gas exhausted from the substrate transport part 120 is substantially the same as the amount of gas to be supplied to the substrate transport part 120, and the pressure in the substrate transport part 120 is maintained substantially constant.

By continuously supplying the inert gas to the substrate transport part 120 and exhausting the gas from the substrate transport part 120 for a predetermined time, the oxygen concentration of the gas in the substrate transport part 120 can be reduced. For example, although the oxygen concentration of the gas in the substrate transport part 120 is about 20% at the time of start of the oxygen reduction mode, the oxygen concentration of the gas in the substrate transport part 120 can be reduced to 1000 ppm or less by the time the oxygen reduction mode ends. For example, the oxygen concentration of the gas in the substrate transport part 120 may be 5 ppm or more and 100 ppm or less.

In the oxygen reduction mode, it is preferable that the substrate transport part 120 not transport the substrate W. However, in the oxygen reduction mode, the transport robot 122 may be operated independently of the transport of the substrate W. Since the gas is agitated in the housing 124 by the movement of the transport robot 122, all of the gas in the housing 124 can be quickly replaced with an inert gas. In this case, it is preferable that the transport robot 122 operate in the maximum range within the movable range.

As shown in FIG. 2B, in the low oxygen maintenance mode, the substrate processing apparatus 100 maintains the oxygen concentration of the gas in the substrate transport part 120. In this case, the gas adjustment part 140 circulates the gas in the substrate transport part 120. Further, the gas adjustment part 140 does not exhaust the gas of the substrate transport part 120. By circulating and using the inert gas in the low oxygen maintenance mode, it is possible to suppress an increase in the cost associated with the use of the inert gas.

For example, the gas supply part 148 stops supplying the inert gas, and the fan of the circulation FFU 144 stops driving. However, the fan of the transport FFU 126 remains driven.

Further, the valve 146v is closed, and the circulation piping 142 is shut off from the outside. Therefore, the gas passing through the circulation piping 142 is not exhausted to the outside through the exhaust pipe 146.

When the transport FFU 126 blows the gas out into the housing 124, the gas in the substrate transport part 120 flows through the circulation piping 142 via the exhaust port 124p. Thereafter, the gas reaches the transport FFU 126, and the transport FFU 126 blows the gas out into the housing 124 again. In this way, the gas in the substrate transport part 120 circulates. The amount of gas to be exhausted from the substrate transport part 120 is substantially the same as the amount of gas to be supplied to the substrate transport part 120 again, and the pressure in the substrate transport part 120 is maintained substantially constant.

However, when the gas slightly leaks from the substrate transport part 120 and/or the circulation piping 142, the pressure of the gas circulating through the substrate transport part 120 and the circulation piping 142 decreases. Therefore, the gas supply part 148 may supply a small amount of an inert gas to the circulation piping 142 via the transport FFU 126.

It is preferable to transport the substrate W inside the substrate transport part 120 in a state in which the oxygen concentration of the gas in the substrate transport part 120 is reduced. For example, the transport robot 122 receives the substrate W from the indexer part 110 and transports the substrate W to the substrate processing part 130 in a state in which the oxygen concentration of the gas in the substrate transport part 120 has decreased. The transport robot 122 receives the substrate W from the substrate processing part 130 and transports the substrate W to the indexer part 110 in a state in which the oxygen concentration of the gas in the substrate transport part 120 has decreased.

After the processing of the substrate W is completed, the oxygen concentration of the gas in the substrate transport part 120 returns from a reduced state to a normal state. For example, when the power of the substrate processing apparatus 100 is turned off, the oxygen concentration of the gas in the substrate transport part 120 returns from the reduced state to the normal state. For maintenance, the oxygen concentration of the gas in the substrate transport part 120 may return from the reduced state to the normal state.

As shown in FIG. 2C, in the case of the oxygen increase mode, the substrate processing apparatus 100 increases the oxygen concentration of the gas in the substrate transport part 120 by replacing the gas in the substrate transport part 120 with air. In this case, the gas adjustment part 140 supplies air to the substrate transport part 120. Further, the gas adjustment part 140 exhausts the gas (mainly an inert gas) from the substrate transport part 120.

For example, when the circulation FFU 144 communicates with the air, the fan of the circulation FFU 144 is driven, and the circulation FFU 144 blows the air out toward the circulation piping 142. Therefore, the air reaches the transport FFU 126 via the circulation piping 142. The transport FFU 126 blows the air out into the housing 124.

The valve 146v is opened, and the exhaust pipe 146 is connected to the outside. Therefore, the inert gas in the substrate transport part 120 passes through the circulation piping 142 and is exhausted to the outside via the exhaust pipe 146. Further, the amount of the inert gas to be exhausted from the substrate transport part 120 is substantially the same as the amount of air to be supplied to the substrate transport part 120, and the pressure in the substrate transport part 120 is maintained substantially constant.

By continuously supplying air to the substrate transport part 120 and exhausting the inert gas from the substrate transport part 120 for a predetermined time, the oxygen concentration of the gas in the substrate transport part 120 can be increased. For example, the oxygen concentration of the gas in the substrate transport part 120 is 1000 ppm or less at the time of the start of the oxygen increase mode, whereas the oxygen concentration of the gas in the substrate transport part 120 increases to about 20% by the time of the oxygen increase mode ends.

As described above, in the substrate processing apparatus 100 of the present embodiment, the substrate transport part 120 is switched to one of the oxygen concentration reduction mode, the low oxygen maintenance mode, and the oxygen increase mode, and the oxygen concentration of the gas in the substrate transport part 120 can be adjusted.

In the substrate processing apparatus 100 of the present embodiment, in the substrate processing part 130, the substrate W is processed by the processing liquid while being held substantially horizontally.

Figure 3:
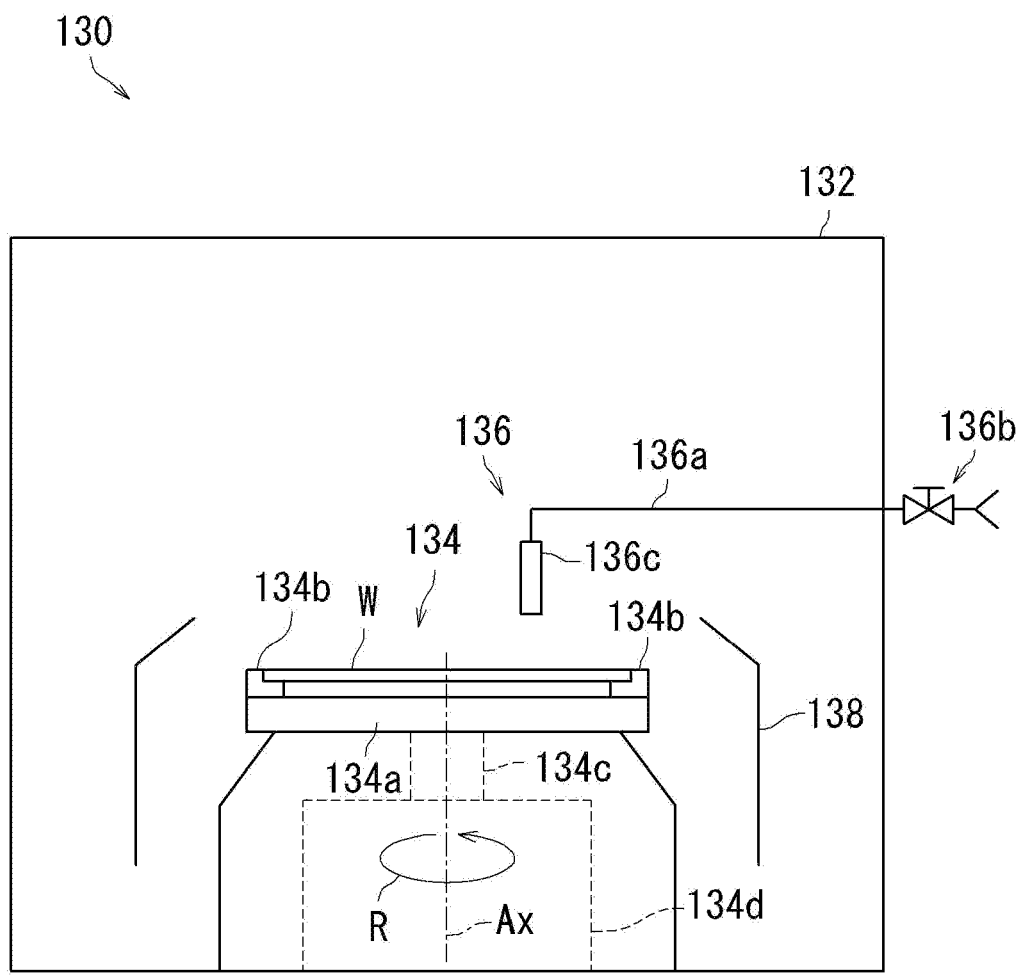
FIG. 3 is a schematic view of a substrate processing part in the substrate processing apparatus of the present embodiment.

Next, the substrate processing part 130 in the substrate processing apparatus 100 according to the present embodiment will be described with reference to FIG. 3. FIG. 3 is a schematic view of the substrate processing part 130 in the substrate processing apparatus 100.

As shown in FIG. 3, the substrate processing part 130 includes a chamber 132, a substrate holding part 134, a processing liquid supply part 136, and a cup 138. The chamber 132 accommodates the substrate W. The chamber 132 has substantially a box shape having an internal space. Here, the substrate processing apparatus 100 is of a single-wafer type that processes substrates W one by one, and the chamber 132 accommodates the substrates W one by one. The substrate W is accommodated in the chamber 132 and processed inside the chamber 132. The chamber 132 accommodates at least a part of the substrate holding part 134, the processing liquid supply part 136, and the cup 138.

The substrate holding part 134 holds the substrate W. The substrate holding part 134 horizontally holds the substrate W such that an upper surface of the substrate W faces upward and a back surface of the substrate W faces vertically downward. Further, the substrate holding part 134 rotates the substrate W while holding the substrate W.

For example, the substrate holding part 134 may be of a clamping type that clamps the end portion of the substrate W. Alternatively, the substrate holding part 134 may have an arbitrary mechanism that holds the substrate W from the back surface. For example, the substrate holding part 134 may be a vacuum type. In this case, the substrate holding part 134 holds the substrate W horizontally by adsorbing a central part of the back surface (lower surface) of the substrate W, which is a non-device formation surface, to the upper surface. Alternatively, the substrate holding part 134 may be a combination of a clamping type in which a plurality of chuck pins are brought into contact with a peripheral end surface of the substrate W and a vacuum type.

For example, the substrate holding part 134 includes a spin base 134a, a chuck member 134b, a shaft 134c, and an electric motor 134d. The chuck member 134b is provided on the spin base 134a. The chuck member 134b chucks the substrate W. Typically, a plurality of chuck members 134b are provided on the spin base 134a.

The shaft 134c is a hollow shaft. The shaft 134c extends in the vertical direction along a rotation axis Ax. The spin base 134a is connected to the upper end of the shaft 134c. The back surface of the substrate W comes into contact with the spin base 134a, and the substrate W is mounted above the spin base 134a.

The spin base 134a has a disk shape and supports the substrate W horizontally. The shaft 134c extends downward from the central part of the spin base 134a. The electric motor 134d gives a rotational force to the shaft 134c. The electric motor 134d rotates the substrate W and the spin base 134a about the rotation axis Ax, by rotating the shaft 134c in a rotation direction R. Here, the rotation direction R is referred to as a counterclockwise direction.

The processing liquid supply part 136 includes a pipe 136a, a valve 136b, and a nozzle 136c. The processing liquid flows through the pipe 136a. The nozzle 136c is connected to the pipe 136a. A processing liquid from a processing liquid supply source is supplied to the pipe 136a. A valve 136b is disposed in the pipe 136a. When the valve 136b is opened, the processing liquid is supplied to the substrate W from the nozzle 136c. The substrate W is processed by the processing liquid.

The cup 138 recovers the processing liquid supplied to the substrate W. The cup 138 is provided around the substrate holding part 134.

For example, the cup 138 recovers the processing liquid to be scattered from the substrate W by the rotation of the substrate W. Further, even when the processing liquid is not supplied to the substrate W, the cup 138 receives the gas flow (air flow) generated by the rotation of the substrate W and causes the air flow to flow downward.

The cup 138 may be movable in the vertical direction. For example, when processing the substrate W with the processing liquid, the cup 138 may rise to cover the side of the substrate W, and after processing the substrate W with the processing liquid, the cup 138 may fall downward from the side of the substrate W. In this way, the substrate W is processed in the substrate processing part 130.

Further, in FIGS. 1A to 2C, although the circulation FFU 144 is attached to the side surface of the circulation piping 142, and the inert gas from the gas supply part 148 is supplied to the circulation piping 142 via the circulation FFU 144, the embodiment is not limited thereto. The circulation FFU 144 may be installed in the circulation piping 142. Further, the inert gas from the gas supply part 148 may be blown out by the circulation FFU 144 after being supplied to the circulation piping 142.

Figure 4:
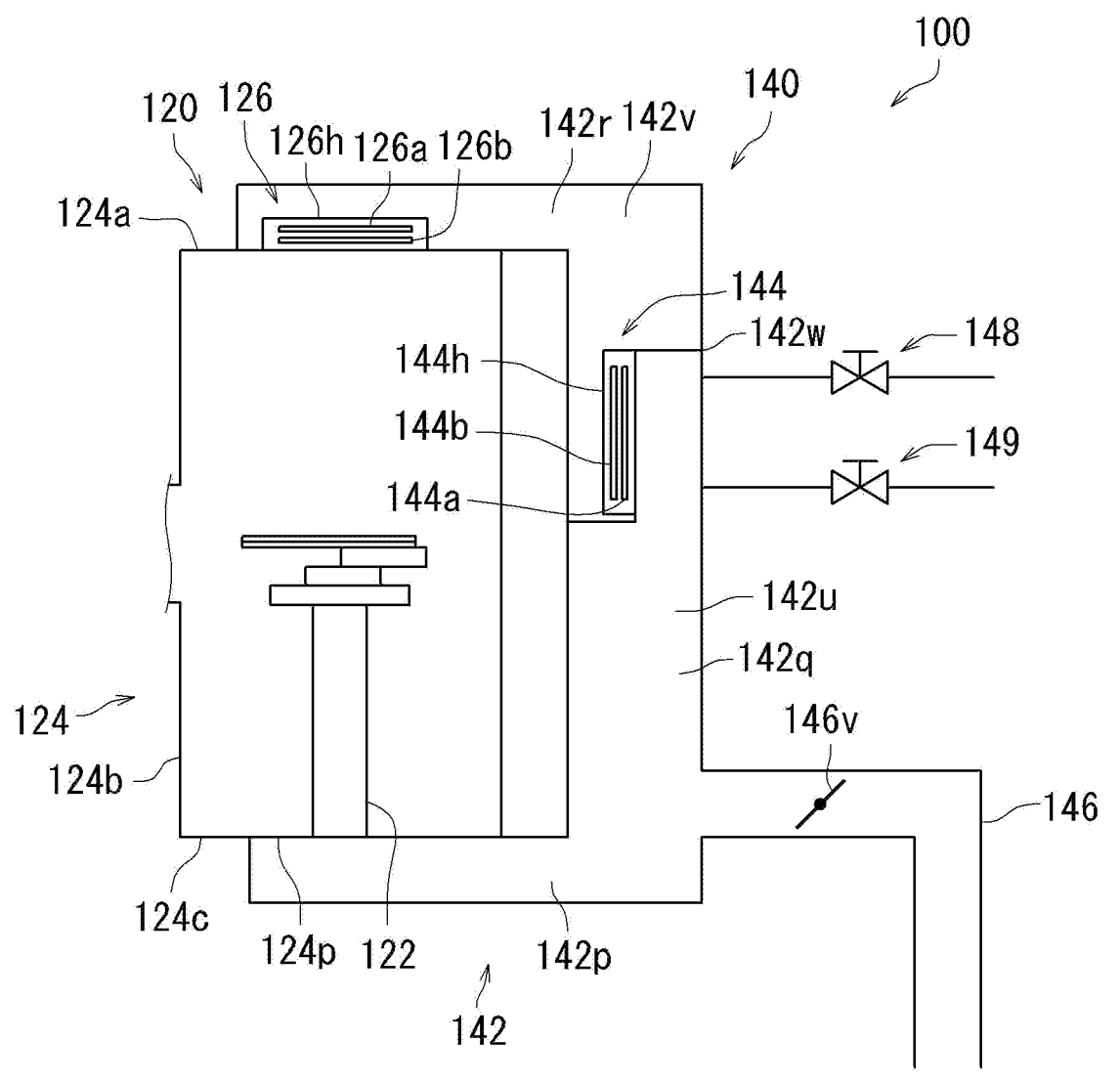
FIG. 4 is a schematic view of a substrate transport part and a gas adjustment part in the substrate processing apparatus of the present embodiment.

Next, the gas adjustment part 140 in the substrate processing apparatus 100 of the present embodiment will be described with reference to FIG. 4. FIG. 4 is a schematic view of the substrate transport part 120 and the gas adjustment part 140 in the substrate processing apparatus 100.

As shown in FIG. 4, a partition wall 142w is provided in the circulation piping 142. The partition wall 142w is disposed between the exhaust port 124p and the transport FFU 126. Here, the partition wall 142w is disposed inside the side pipe 142q. The circulation piping 142 is divided into an upstream part 142u and a downstream part 142v by a partition wall 142w. The upstream part 142u is formed from the bottom pipe 142p and a part of the side pipe 142q. The downstream part 142v is formed from a remaining part of the side pipe 142q and the top pipe 142r.

An opening part is provided in the partition wall 142w. The opening part of the partition wall 142w connects the upstream part 142u and the downstream part 142v.

The circulation FFU 144 is attached to the partition wall 142w. Specifically, the circulation FFU 144 is installed at the opening part of the partition wall 142w in the downstream part 142v. The upstream part 142u and the downstream part 142v of the circulation piping 142 communicate with each other by a region of the partition wall 142w in which the circulation FFU 144 is installed. The circulation FFU 144 suctions the gas of the upstream part 142u and blows out the gas to the downstream part 142v.

The circulation FFU 144 has a fan 144a, a filter 144b, and a housing 144h. The fan 144a and the filter 144b are disposed in the housing 144h. The housing 144h is provided with a suction port for suctioning gas and an outlet for blowing the gas. The suction port of the circulation FFU 144 faces the opening part of the partition wall 142w, and communicates with the upstream part 142u via the opening part.

In the circulation FFU 144, the fan 144a is disposed on the upstream side of the circulation path, and the filter 144b is disposed on the downstream side of the circulation path. The airflow blown out by the fan 144a is filtered by the filter 144b when passing through the filter 144b.

The housing 144h extends in the longitudinal direction. The housing 144h is attached such that the longitudinal direction of the circulation FFU 144 follows the partition wall 142w of the circulation piping 142. Here, the circulation FFU 144 is disposed on the partition wall 142w such that the longitudinal direction of the circulation FFU 144 follows the vertical direction. For this reason, the circulation FFU 144 is disposed along the flow path of the circulation piping 142. By disposing the circulation FFU 144 inside the circulation piping 142 along the vertical direction, the circulation FFU 144 can be installed even in the relatively thin circulation piping 142.

The inert gas supply part 148 supplies the inert gas to the circulation piping 142. The inert gas supply part 148 supplies the inert gas to the circulation piping 142 in the oxygen reduction mode and the low oxygen maintenance mode.

Specifically, the inert gas supply part 148 communicates with the side surface of the upstream part 142u of the circulation piping 142. The inert gas supply part 148 supplies the inert gas to the upstream part 142u of the circulation piping 142.

The circulation FFU 144 suctions the inert gas supplied from the inert gas supply part 148, filters the inert gas, and blows out the inert gas. Here, the circulation FFU 144 suctions the inert gas in the upstream part 142u, filters the inert gas, and blows out the inert gas toward the downstream part 142v.

The air supply part 149 supplies air to the circulation piping 142. The air supply part 149 supplies air to the circulation piping 142 in the oxygen increase mode.

Specifically, the air supply part 149 communicates with the side surface of the upstream part 142u of the circulation piping 142. The air supply part 149 supplies air to the upstream part 142u of the circulation piping 142.

The circulation FFU 144 suctions the air supplied from the air supply part 149, filters the air, and blows out the air. Here, the circulation FFU 144 suctions air in the upstream part 142u, filters the air, and blows out the air toward the downstream part 142v.

The circulation FFU 144 is preferably driven even when the inert gas supply part 148 and the air supply part 149 do not supply inert gas and air, respectively. In this case, the circulation FFU 144 suctions the gas in the upstream part 142u, filters the gas, and blows out the gas toward the downstream part 142v.

The gas supply part 148 and the air supply part 149 are connected to the side surface of the upstream part 142u of the circulation piping 142. It is preferable that the connecting portion between the gas supply part 148 and the air supply part 149 and the upstream part 142u of the circulation piping 142 faces the circulation FFU 144 via the upstream part 142u of the circulation piping 142. Therefore, the circulation FFU 144 can efficiently suction the inert gas supplied from the gas supply part 148 and the air supplied from the air supply part 149, and can efficiently blow out the air toward the downstream part 142v.

The transport FFU 126 has a fan 126a, a filter 126b, and a housing 126h. The fan 126a and the filter 126b are disposed inside the housing 126h. The housing 126h is provided with a suction port for suctioning the gas and an outlet for blowing out the gas.

In the transport FFU 126, the fan 126a is disposed on the upstream side of the circulation path, and the filter 126b is disposed on the downstream side of the circulation path. The airflow blown out by the fan 126a is filtered by the filter 126b when passing through the filter 126b.

Further, in the substrate processing apparatus 100 shown in FIGS. 1A to 4, although the gas supply part 148 supplies an inert gas from one pipe, the present embodiment is not limited thereto. The gas supply part 148 may supply the inert gas from a plurality of pipes.

Figure 5:
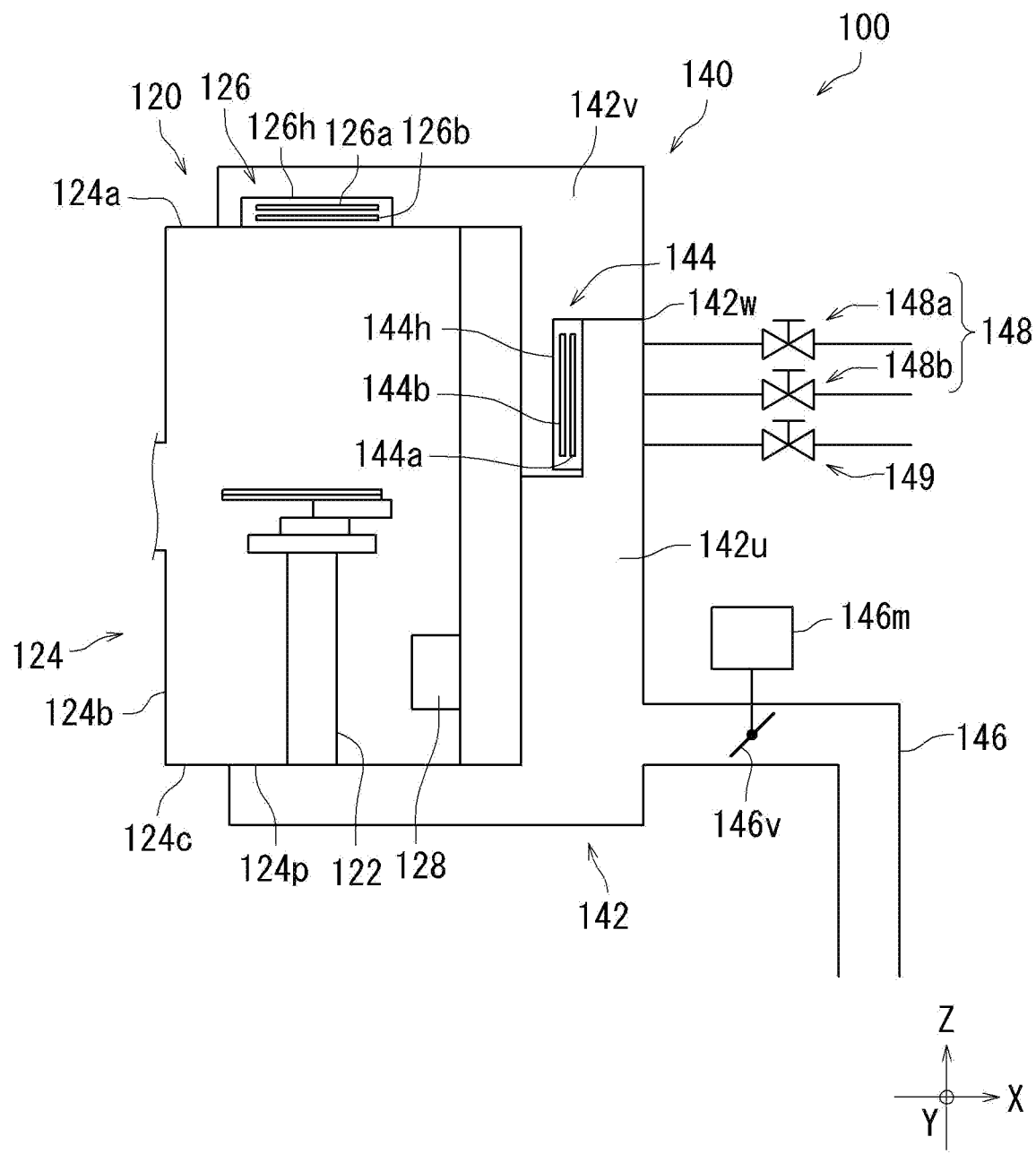
FIG. 5 is a schematic view of the substrate transport part and the gas adjustment part in the substrate processing apparatus of the present embodiment.

Next, the gas adjustment part 140 in the substrate processing apparatus 100 of the present embodiment will be described with reference to FIG. 5. FIG. 5 is a schematic view of the substrate transport part 120 and the gas adjustment part 140 in the substrate processing apparatus 100. The gas adjustment part 140 shown in FIG. 5 has the same configuration as that of the gas adjustment part 140 described above with reference to FIG. 4 except that the gas supply part 148 has a plurality of pipes. Repeated descriptions will not be provided to avoid redundancy.

As shown in FIG. 5, the inert gas supply part 148 has a first supply part 148a and a second supply part 148b. The first supply part 148a supplies the inert gas to the circulation piping 142. The first supply part 148a supplies an inert gas to the circulation piping 142 at a relatively low flow rate. For example, the first supply part 148a supplies the inert gas to the circulation piping 142 in the oxygen reduction mode and/or the low oxygen maintenance mode.

The second supply part 148b supplies the inert gas to the circulation piping 142. The second supply part 148b supplies the inert gas to the circulation piping 142 at a higher flow rate than the first supply part 148a. For example, the second supply part 148b supplies the inert gas to the circulation piping 142 in the oxygen reduction mode.

For example, the flow rate of the inert gas from the second supply part 148b may be twice or more and 100 times or less with respect to the flow rate of the inert gas from the first supply part 148a. The type of the inert gas to be supplied by the second supply part 148b is preferably the same as the type of the inert gas to be supplied by the first supply part 148a.

The first supply part 148a, the second supply part 148b, and the air supply part 149 are connected to the side surface of the upstream part 142u of the circulation piping 142. It is preferable that a connecting portion between the first supply part 148a, the second supply part 148b, and the air supply part 149 and the upstream part 142u of the circulation piping 142 faces the circulation FFU 144 via the upstream part 142u of the circulation piping 142. Therefore, the circulation FFU 144 efficiently suctions the inert gas supplied from the first supply part 148a and the second supply part 148b and the air supplied from the air supply part 149, and efficiently blows out the air toward the downstream part 142v.

For example, in the oxygen reduction mode, the first supply part 148a and the second supply part 148b supply the inert gas to the circulation piping 142, respectively. By supplying the inert gas, using the first supply part 148a and the second supply part 148b, the oxygen concentration of the gas in the substrate transport part 120 can be rapidly reduced.

Further, in the low oxygen maintenance mode, the first supply part 148a supplies the inert gas to the circulation piping 142. At this time, the second supply part 148b does not supply the inert gas to the circulation piping 142. This makes it possible to maintain the oxygen concentration of the gas in the substrate transport part 120, while suppressing the consumption of the inert gas.

It is preferable that an oxygen concentration meter 128 be disposed in the substrate transport part 120 as shown in FIG. 5. The pressure in the substrate transport part 120 can be measured by the oxygen concentration meter 128. Further, the valve 146v disposed in the exhaust pipe 146 is opened and closed by driving the motor 146m. The opening and closing of the valve 146v is preferably controlled by the motor 146m which is driven on the basis of the measurement result of the oxygen concentration meter 128.

For example, the control part 102 (see FIG. 1B) controls the valve 146v and controls the first supply part 148a, the second supply part 148b, and the air supply part 149 on the basis of the measurement result of the oxygen concentration meter 128. Therefore, the oxygen concentration of the gas in the substrate transport part 120 can be appropriately adjusted.

In the housing 124, although the air pressure inside the transport robot 122 is almost constant with the air pressure outside the transport robot 122, a fan is installed inside the transport robot 122 to set the inside of the transport robot 122 to a slightly negative pressure with respect to the outside so that the fine dust inside the transport robot 122 does not diffuse to the outside of the transport robot 122 by the operation of the transport robot 122. In this case, it is preferable that the housing 124 be provided with an exhaust port 124p located outside the transport robot 122 and another exhaust port that connects the inside of the transport robot 122 and the circulation piping 142.

Figure 6:
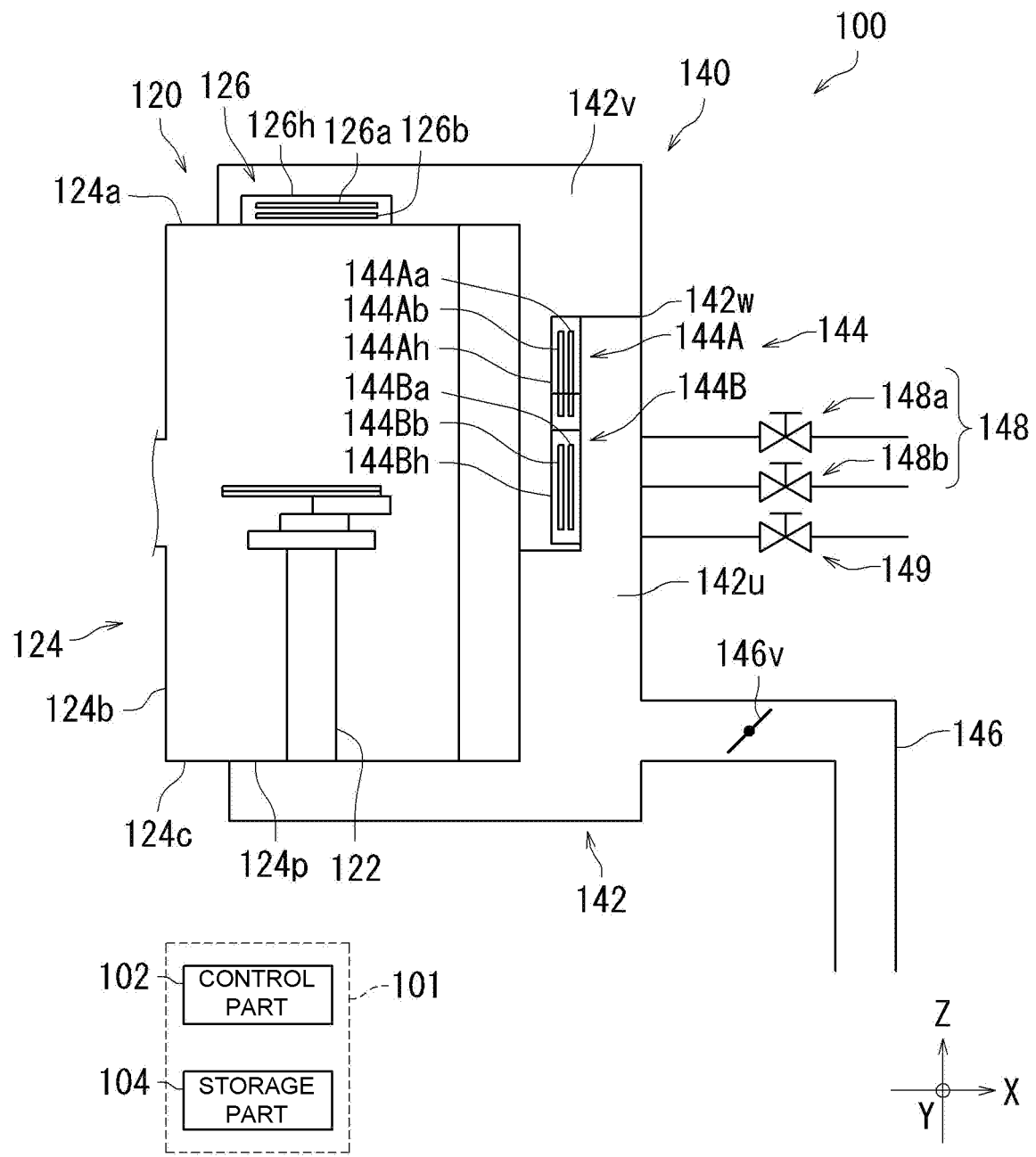
FIG. 6 is a schematic view of the substrate transport part and the gas adjustment part in the substrate processing apparatus of the present embodiment.

Next, the gas adjustment part 140 in the substrate processing apparatus 100 according to the present embodiment will be described with reference to FIG. 6. FIG. 6 is a schematic view of the substrate transport part 120 and the gas adjustment part 140 in the substrate processing apparatus 100. The gas adjustment part 140 shown in FIG. 6 has the same configuration as the gas adjustment part 140 described above with reference to FIG. 5 except that a plurality of fan filter units is disposed side by side as the circulation FFU 144. Therefore, repeated descriptions will not be provided to avoid redundancy.

As shown in FIG. 6, a first fan filter unit 144A and a second fan filter unit 144B are disposed side by side as the circulation FFU 144. In this specification, the first fan filter unit 144A may be described as a FFU 144A, and the second fan filter unit 144B may be described as a FFU 144B.

The FFU 144A has a fan 144Aa, a filter 144Ab, and a housing 144Ah. The second fan filter unit 144B has a fan 144Ba, a filter 144Bb, and a housing 144Bh.

The FFU 144A and the second fan filter unit 144B are disposed along the flow path of the circulation piping 142, respectively. Here, the second fan filter unit 144B is disposed downstream of the FFU 144A. Further, the FFU 144A and the second fan filter unit 144B are installed on the partition wall 142w, respectively.

The first supply part 148a, the second supply part 148b, and the air supply part 149 are connected to the side surface of the upstream part 142u of the circulation piping 142. It is preferable that a connecting portion between the first supply part 148a, the second supply part 148b, and the air supply part 149 and the upstream part 142u of the circulation piping 142 faces at least one of the FFU 144A and the FFU 144B, or faces between the FFU 144A and the FFU 144B. In particular, it is preferable that the connecting portion between the first supply part 148a, the second supply part 148b, and the air supply part 149 and the upstream part 142u of the circulation piping 142 faces the FFU 144B, or faces between the FFU 144A and the FFU 144B. Therefore, the circulation FFU 144 efficiently suctions the inert gas supplied from the first supply part 148a and the second supply part 148b and the air supplied from the air supply part 149, and can efficiently blow out the air toward the downstream part 142v.

In the substrate processing apparatus 100 of the present embodiment, the control part 102 controls the first supply part 148a, the second supply part 148b, and the air supply part 149 in addition to the transport robot 122, the transport FFU 126, and the circulation FFU 144. Therefore, the oxygen concentration of the gas in the substrate transport part 120 can be adjusted.

Figure 7A:
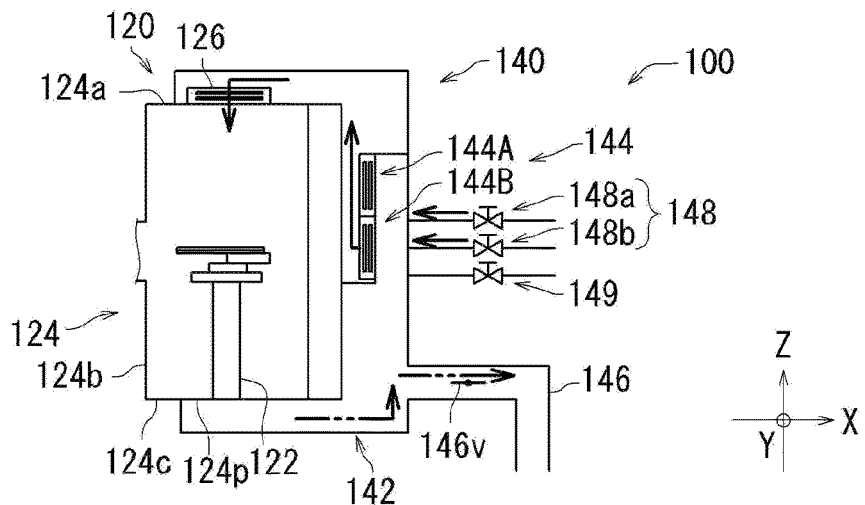
FIGS. 7A to 7C are schematic views of the substrate processing apparatus of the present embodiment in the oxygen reduction mode, the low oxygen maintenance mode, and the oxygen increase mode, respectively.
Figure 7B:
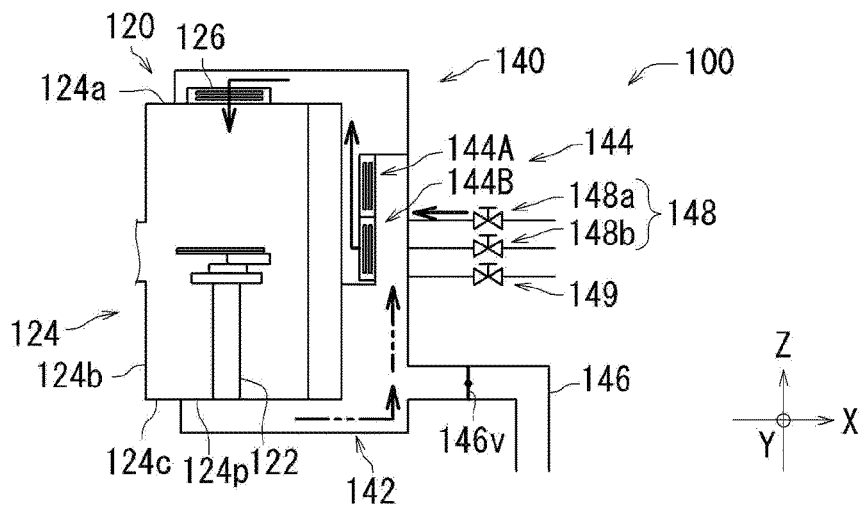
Figure 7C:
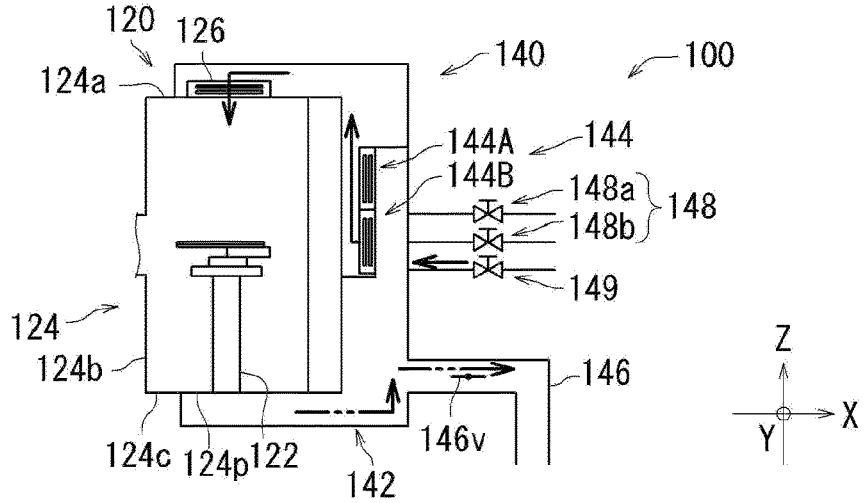

Hereinafter, adjustment of the oxygen concentration of the substrate transport part 120 performed by the gas adjustment part 140 in the substrate processing apparatus 100 of the present embodiment will be described with reference to FIGS. 7A to 7C. FIGS. 7A to 7C are schematic views of the substrate processing apparatus 100 in the oxygen reduction mode, the low oxygen maintenance mode, and the oxygen increase mode, respectively. FIGS. 7A to 7C show only the substrate transport part 120 and the gas adjustment part 140 in the substrate processing apparatus 100 shown in FIG. 1B.

As shown in FIG. 7A, in the case of the oxygen reduction mode, the substrate processing apparatus 100 reduces the oxygen concentration of the gas in the substrate transport part 120 by replacing the gas in the substrate transport part 120 with an inert gas. In this case, the first supply part 148a and the second supply part 148b supply the inert gas to the circulation piping 142. The FFU 144A and the FFU 144B are driven to blow out the inert gas downstream. The inert gas flowing through the circulation piping 142 reaches the transport FFU 126, and the transport FFU 126 blows out the inert gas into the housing 124.

The valve 146v is opened, and the exhaust pipe 146 exhausts the gas of the substrate transport part 120. For this reason, the air of the substrate transport part 120 passes through the circulation piping 142 and is exhausted to the outside via the exhaust pipe 146.

By continuously supplying the inert gas to the substrate transport part 120 and exhausting the gas from the substrate transport part 120 for a predetermined time, the oxygen concentration of the gas in the substrate transport part 120 can be reduced. For example, before the start of the oxygen reduction mode, the oxygen concentration of the gas in the substrate transport part 120 is about 20%. However, when the oxygen reduction mode ends, the oxygen concentration of the gas in the substrate transport part 120 can be reduced to about 1000 ppm.

As shown in FIG. 7B, in the case of the low oxygen maintenance mode, the substrate processing apparatus 100 maintains the oxygen concentration of the gas in the substrate transport part 120. In this case, the first supply part 148a supplies the inert gas to the circulation piping 142, and meanwhile, the second supply part 148b does not supply the inert gas to the circulation piping 142. The FFU 144A and the FFU 144B are driven to blow out the inert gas downstream. The inert gas flowing through the circulation piping 142 reaches the transport FFU 126, and the transport FFU 126 blows out the inert gas into the housing 124.

The valve 146v is closed, and the exhaust pipe 146 does not exhaust the gas of the substrate transport part 120. Therefore, the air of the substrate transport part 120 passes through the circulation piping 142 via the exhaust port 124p and reaches the FFU 144A and the FFU 144B. The FFU 144A and the FFU 144B blow out gas into the housing 124 again. The flow rate from the first supply part 148a is preferably about an amount of gas leaking from the substrate transport part 120 and/or the circulation piping 142.

In this way, the substrate transport part 120 transports the substrate W in a state in which the oxygen concentration of the gas in the substrate transport part 120 decreases. After the processing of the substrate W is completed, the oxygen concentration of the gas in the substrate transport part 120 returns from the reduced state to the normal state.

As shown in FIG. 7C, in the case of the oxygen increase mode, the substrate processing apparatus 100 increases the oxygen concentration of the gas in the substrate transport part 120 by replacing the gas of the substrate transport part 120 with air. In this case, the air supply part 149 supplies air to the circulation piping 142. The FFU 144A and the FFU 144B are driven to blow out the air downstream. The air flowing through the circulation piping 142 reaches the transport FFU 126, and the transport FFU 126 blows out the air into the housing 124.

The valve 146v is opened, and the exhaust pipe 146 exhausts the gas (mainly, an inert gas) of the substrate transport part 120. Therefore, the gas of the substrate transport part 120 passes through the circulation piping 142 and is exhausted to the outside via the exhaust pipe 146.

By continuously supplying air to the substrate transport part 120 and exhausting gas from the substrate transport part 120 for a predetermined time, the oxygen concentration of the gas in the substrate transport part 120 can be increased. For example, before the start of the oxygen increase mode, the oxygen concentration of the gas in the substrate transport part 120 is about 1000 ppm. However, when the oxygen increase mode ends, the oxygen concentration of the gas in the substrate transport part 120 can be increased up to about 20%.

As described above, in the substrate processing apparatus 100 of the present embodiment, the substrate transport part 120 can switch to any one of the oxygen concentration reduction mode, the low oxygen maintenance mode, and the oxygen increase mode, and the oxygen concentration of gas in the substrate transport part 120 can be controlled.

In the circulation FFU 144 shown in FIGS. 6 to 7C, although the FFU 144A and the FFU 144B are arranged to be aligned in the vertical direction, the present embodiment is not limited thereto. The FFU 144A and FFU 144B may be arranged to be aligned in a horizontal direction. For example, the FFU 144A and the FFU 144B may be arranged to be aligned in the Y direction.

Typically, the transport robot 122 is coated with a lubricant of an organic solvent so that the transport robot 122 operates smoothly. In this case, when the vaporized component of the lubricant flows through the circulation piping 142 and passes through the circulation FFU 144 and the transport FFU 126, the fan 144a, the filter 144b, the fan 126a, and/or the filter 126b may be contaminated. Therefore, it is preferable that at least one of the circulation FFU 144 and the transport FFU 126 be provided with a chemical filter. In particular, it is preferable that the circulation FFU 144 located on the upstream side in the circulation piping 142 includes a chemical filter.

Figure 8A:
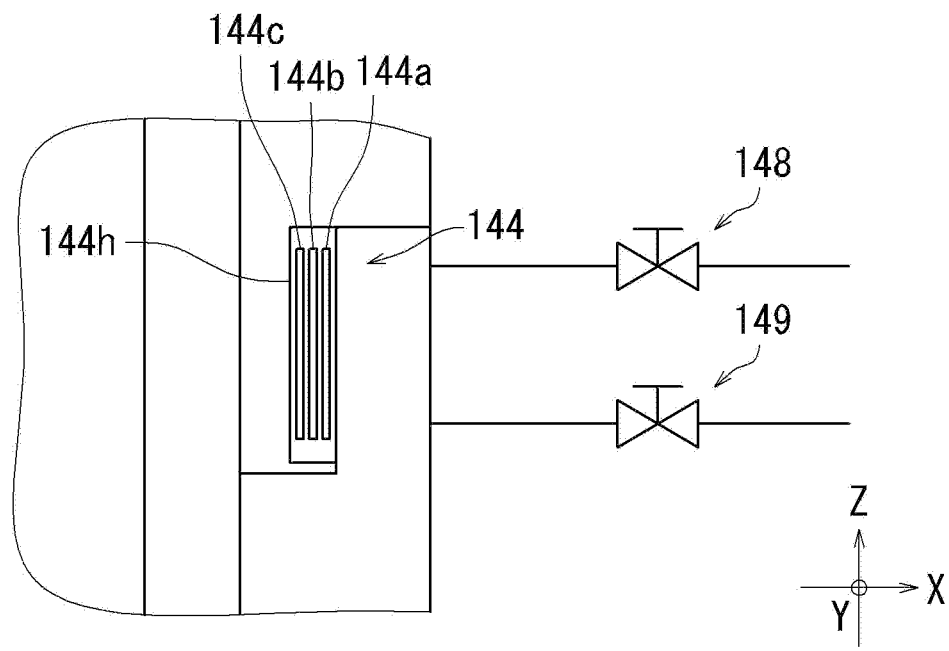
FIGS. 8A and 8B are schematic partial enlarged views of the gas adjustment part in the substrate processing apparatus of the present embodiment.

Here, the configuration of the circulation FFU 144 of the gas adjustment part 140 in the substrate processing apparatus 100 according to the present embodiment will be described with reference to FIGS. 8A and 8B. FIG. 8A is a schematic partial enlarged view of the gas adjustment part 140 in the substrate processing apparatus 100.

As shown in FIG. 8A, the circulation FFU 144 further includes a chemical filter 144c in addition to the fan 144a and the filter 144b. Here, the fan 144a, the filter 144b, and the chemical filter 144c are disposed in this order from the upstream side to the downstream side of the circulation piping 142.

The fan 144a suctions the external gas and blows out gas in a predetermined direction. The filter 144b filters the floating matter of the passing gas. The chemical filter 144c adsorbs the organic solvent of the passing gas. Even if the lubricant of the transport robot 122 evaporates and gets into the gas, the chemical filter 144c can adsorb the vaporized components of the lubricant, and it is possible to suppress the fan 144a and the filter 144b from being contaminated by the lubricant.

Further, in the circulation FFU 144 shown in FIG. 8A, although the fan 144a, the filter 144b, and the chemical filter 144c are disposed in this order from the upstream side to the downstream side of the circulation piping 142, the present embodiment is not limited thereto. The fan 144a, the filter 144b, and the chemical filter 144c may be disposed in another order.

Figure 8B:
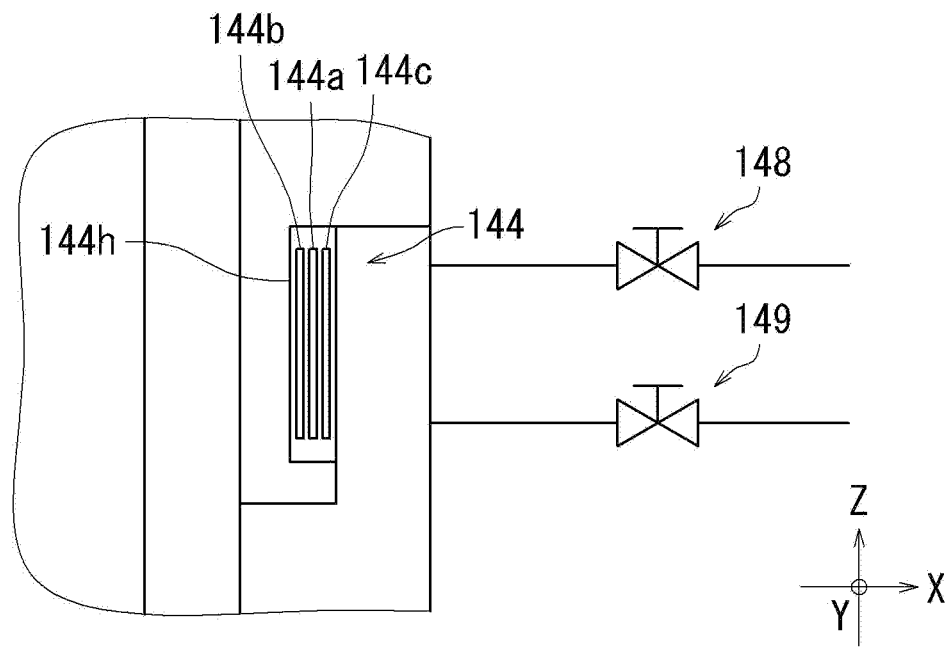

As shown in FIG. 8B, the chemical filter 144c may be disposed upstream of the fan 144a and the filter 144b. Accordingly, even when a relatively large amount of the vaporized component of the organic solvent flows through the circulation piping 142 at the time of starting circulation or driving of the transport robot 122, it is possible to suppress the fan 144a and the filter 144b from being contaminated by the organic solvent.

In FIG. 8B, although the chemical filter 144c is disposed inside the housing 144h of the circulation FFU 144, the present embodiment is not limited thereto. The chemical filter 144c may be attached to the outside of the housing 144h. Alternatively, the chemical filter 144c may be disposed at a location away from the housing 144h. For example, the chemical filter 144c may be disposed in the upstream part 142u of the circulation piping 142.

In this way the gas supply part 148 may supply gas to the fan 144a and the filter 144b without passing through the chemical filter 144c. Thus, the organic solvent in the circulation piping 142 is adsorbed by the chemical filter 144c, and even if the chemical filter 144c is slightly contaminated, the inert gas from the gas supply part 148 can be supplied to the downstream side of the circulation piping 142 with little contamination.

Although the circulation FFU 144 of the gas adjustment part 140 shown in FIGS. 1A to 8B is disposed along a flow path in the vertical direction of the circulation piping 142, and the longitudinal direction of the circulation FFU 144 is disposed in the vertical direction, the present embodiment is not limited thereto. The circulation FFU 144 may be disposed along the flow path in the horizontal direction of the circulation piping 142, and the longitudinal direction of the circulation FFU 144 may be disposed in the horizontal direction. For example, when the horizontal part of the circulation piping 142 extending in the horizontal direction is longer than the vertical part of the circulation piping 142 extending in the vertical direction, the longitudinal direction of the circulation FFU 144 is preferably disposed in the horizontal direction. Accordingly, the oxygen component remaining in the circulation piping 142 can be reduced, and it is possible to suppress the oxidation of the substrate W when the substrate W is transported in the substrate transport part 120.

Although the substrate processing apparatus 100 shown in FIGS. 1A and 1B includes one substrate processing part 130, the present embodiment is not limited thereto. The substrate processing apparatus 100 may include a plurality of substrate processing parts 130.

Figure 9:
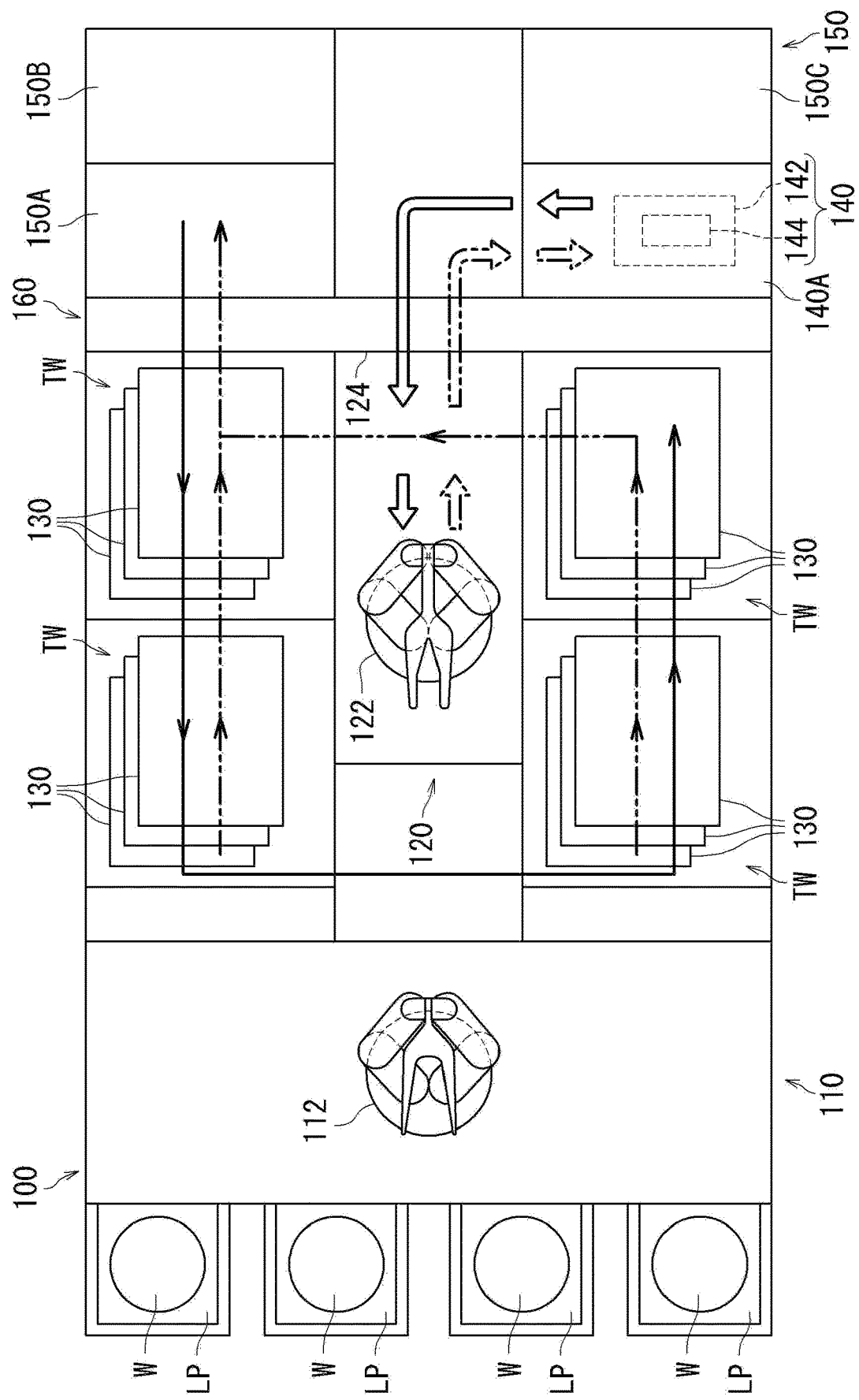
FIG. 9 is a schematic view of the substrate processing apparatus of the present embodiment.

Hereinafter, the substrate processing apparatus 100 according to the present embodiment will be described with reference to FIG. 9. FIG. 9 is a schematic top view of the substrate processing apparatus 100. The substrate processing apparatus 100 shown in FIG. 9 includes a plurality of substrate processing parts 130, has the same configuration as that of the substrate processing apparatus 100 described above with reference to FIGS. 1A and 1B except that it further includes a gas circulation cabinet 140A, a processing liquid cabinet 150, and a boundary wall 160, and repeated description will not be provided to avoid redundancy.

As shown in FIG. 9, the substrate processing apparatus 100 of the present embodiment includes a plurality of substrate processing parts 130. The plurality of substrate processing parts 130 form a plurality of towers TW (four towers TW in FIG. 9) disposed to surround the transport robot 122 in a plan view. Each tower TW includes a plurality of substrate processing parts 130 (three substrate processing parts in FIG. 9) stacked vertically.

Further, the substrate processing apparatus 100 of the present embodiment further includes a gas circulation cabinet 140A, a processing liquid cabinet 150, and a boundary wall 160, in addition to the indexer part 110, the substrate transport part 120, the substrate processing part 130, and the gas adjustment part 140. The gas circulation cabinet 140A accommodates a part of the circulation piping 142 and the circulation FFU 144. For example, the gas circulation cabinet 140A accommodates the side pipe 142q (see FIGS. 1B and 4) of the circulation piping 142 together with the circulation FFU 144.

The gas circulation cabinet 140A supplies gas to the substrate transport part 120. Further, the gas circulation cabinet 140A exhausts the gas of the substrate transport part 120.

In the substrate processing apparatus 100, three processing liquid cabinets 150A, 150B, and 150C are disposed as the processing liquid cabinet 150. The processing liquid cabinet 150A is disposed to be adjacent to the processing liquid cabinet 150B. Further, the processing liquid cabinet 150C is disposed to be adjacent to the gas circulation cabinet 140A.

The processing liquids of each of the processing liquid cabinets 150A, 150B, and 150C are supplied to the substrate processing part 130. FIG. 9 shows paths which supplies and recovers the processing liquid from the processing liquid cabinet 150A to each of the towers TW to prevent the drawing from being excessively complicated.

The boundary wall 160 is located at a boundary between a region in which the indexer part 110, the substrate transport part 120 and the substrate processing part 130 are installed, and a region in which the gas circulation cabinet 140A and the processing liquid cabinet 150 are installed. The height of the boundary wall 160 is preferably substantially the same as the height of the tower TW of the substrate processing part 130.

In the region in which the indexer part 110, the substrate transport part 120, and the substrate processing part 130 are installed, the substrate W is transported or processed. In the region in which the gas circulation cabinet 140A and the processing liquid cabinet 150 are installed, the gas, gas or processing liquid to be supplied to the substrate transport part 120 and/or the substrate processing part 130 is adjusted.

It is preferable that an operator can enter the region in which the gas circulation cabinet 140A and the processing liquid cabinet 150 are installed to perform the operation even during the transportation or processing of the substrate W. For example, an operation region is formed between the processing liquid cabinet 150A and the processing liquid cabinet 150B, and the gas circulation cabinet 140A and the processing liquid cabinet 150C. The operator of the substrate processing apparatus 100 can enter the operation region even during transportation or processing of the substrate W, and can adjust the gas, gas and/or processing liquid of the gas circulation cabinet 140A and the processing liquid cabinet 150.

The disclosure provides a substrate processing apparatus which includes an indexer robot, an indexer part, a substrate processing part, a transport robot, a substrate transport part, a transport fan filter unit, an exhaust port, a circulation piping, an exhaust pipe, an inert gas supply part, and a circulation fan filter unit. The indexer robot loads a substrate in. The indexer robot is installed in the indexer part. The substrate processing part processes the substrate. The transport robot transports the substrate between the indexer part and the substrate processing part. The transport robot is installed in the substrate transport part. The transport fan filter unit is provided on an upper part of the substrate transport part. The exhaust port is provided in the substrate transport part. The circulation piping allows the exhaust port of the substrate transport part and the transport fan filter unit to communicate with each other. The exhaust pipe is connected to the circulation piping. The inert gas supply part supplies an inert gas to the circulation piping. The circulation fan filter unit is disposed downstream of a connecting portion of the circulating pipe with the exhaust pipe to be parallel to a flow path of the circulating pipe.

In an embodiment, the circulation fan filter unit may be disposed to extend in a vertical direction.

In an embodiment, the substrate processing apparatus may further include a valve which adjusts a flow of gas passing through the exhaust pipe.

In an embodiment, the circulation fan filter unit may blow the inert gas supplied from the inert gas supply part out to the circulation piping.

In an embodiment, the inert gas supply part may have a first supply part which supplies the inert gas to the circulation piping at a first flow rate, and a second supply part which supplies the inert gas to the circulation piping at a second flow rate greater than the first flow rate.

In an embodiment, in the case of an oxygen reduction mode, each of the first supply part and the second supply part may supply the inert gas to the circulation piping, and in the case of a low oxygen maintenance mode, the first supply part may supply the inert gas to the circulation piping.

In an embodiment, the substrate processing apparatus may further include an air supply part which supplies air to the circulation piping.

In an embodiment, in the case of an oxygen increase mode, the air supply part may supply the air to the circulation piping.

In an embodiment, the circulation fan filter unit may blow out the air, which is supplied from the air supply part, to the circulation piping.

In an embodiment, a plurality of fan filter units may be disposed side by side as the circulation fan filter unit.

In an embodiment, the circulation fan filter unit may include a fan, a filter, and a chemical filter.

In an embodiment, the substrate processing apparatus may further include a gas circulation cabinet which accommodates a part of the circulation piping and the circulation fan filter unit.

In an embodiment, the substrate processing apparatus may further include a processing liquid cabinet which is adjacent to the gas circulation cabinet to supply a processing liquid to the substrate processing part.

Hereinabove, embodiments of the disclosure have been described with reference to the drawings. However, the disclosure is not limited to the foregoing embodiments and can be performed in various forms within a range not departing from the gist thereof. In addition, a plurality of constituent elements disclosed in the foregoing embodiments can be modified and changed suitably. For example, a certain constituent element of all the constituent elements shown in a certain embodiment may be added to a constituent element of another embodiment, or some constituent elements of all the constituent elements shown in a certain embodiment may be deleted from the embodiments. In addition, in order to make the disclosure easy to understand, the drawings schematically show each of the constituent elements as a main constituent. For the sake of making the drawings easy to understand, there are cases where actually shown constituent elements may differ from respective constituent elements in thickness, length, number, gap, and the like. In addition, the constitution of each of the constituent elements shown in the foregoing embodiments is an example and is not particularly limited. It goes without saying that various changes can be made within a range not departing practically from the effects of the disclosure.

What is claimed is:

1. A substrate processing apparatus comprising:
   an indexer robot which loads a substrate in;
   an indexer part in which the indexer robot is installed;
   a substrate processing part which processes the substrate;
   a transport robot which transports the substrate between the indexer part and the substrate processing part;
   a substrate transport part in which the transport robot is installed;
   a transport fan filter unit provided on an upper part of the substrate transport part;
   an exhaust port provided in the substrate transport part;
   a circulation piping through which the exhaust port of the substrate transport part communicates with the transport fan filter unit;
   an exhaust pipe connected to the circulation piping;
   an inert gas supply part which supplies an inert gas to the circulation piping; and
   a circulation fan filter unit disposed downstream of a connecting portion of the circulation piping with the exhaust pipe to be parallel to a flow path of the circulation piping,
   wherein a partition wall is disposed inside a side pipe of the circulation piping to divide the side pipe of the circulation piping into an upstream part and a downstream part,
   the circulation fan filter unit includes:
      a fan extending in a vertical direction; and
      a filter located adjacent to the fan and extending in the vertical direction,
   the fan sucks a gas in the upstream part of the side pipe from a suction port at a side of the fan and blows the gas to the filter from an outlet at another side of the fan, and
   the filter receives the gas blown by the fan from a port at a side of the filter and allows the gas to flow to the downstream part of the side pipe from an outlet at a side of the filter.

2. The substrate processing apparatus according to claim 1, wherein the circulation fan filter unit is disposed to extend in the vertical direction.

3. The substrate processing apparatus according to claim 1, further comprising a valve which adjusts a flow of a gas passing through the exhaust pipe.

4. The substrate processing apparatus according to claim 1, wherein the circulation fan filter unit blows the inert gas, which is supplied from the inert gas supply part, out to the circulation piping.

5. The substrate processing apparatus according to claim 1, wherein the inert gas supply part has
   a first supply part which supplies the inert gas to the circulation piping at a first flow rate, and
   a second supply part which supplies the inert gas to the circulation piping at a second flow rate greater than the first flow rate.

6. The substrate processing apparatus according to claim 5, wherein, in the case of an oxygen reduction mode, each of the first supply part and the second supply part supplies the inert gas to the circulation piping, and
   in the case of a low oxygen maintenance mode, the first supply part supplies the inert gas to the circulation piping.

7. The substrate processing apparatus according to claim 1, further comprising an air supply part which supplies air to the circulation piping.

8. The substrate processing apparatus according to claim 7, wherein, in the case of an oxygen increase mode, the air supply part supplies the air to the circulation piping.

9. The substrate processing apparatus according to claim 7, wherein the circulation fan filter unit blows the air supplied from the air supply part out to the circulation piping.

10. The substrate processing apparatus according to claim 1, wherein a plurality of fan filter units are disposed side by side as the circulation fan filter unit.

11. The substrate processing apparatus according to claim 1, wherein the circulation fan filter unit further includes a chemical filter.

12. The substrate processing apparatus according to claim 1, further comprising a gas circulation cabinet which accommodates a part of the circulation piping and the circulation fan filter unit.

13. The substrate processing apparatus according to claim 12, further comprising a processing liquid cabinet which is adjacent to the gas circulation cabinet to supply a processing liquid to the substrate processing part.

* * * * *